(12) United States Patent
Shinohara et al.

(10) Patent No.: US 6,281,536 B1
(45) Date of Patent: Aug. 28, 2001

(54) FERROELECTRIC MEMORY DEVICE WITH IMPROVED FERROELECTRIC CAPACITY CHARACTERISTIC

(75) Inventors: Sota Shinohara; Kazushi Amanuma; Yukinobu Murao; Yuukoh Katoh; Tsuneo Takeuchi; Yoshihiro Hayashi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/287,413

(22) Filed: Apr. 7, 1999

(30) Foreign Application Priority Data

Apr. 8, 1998 (JP) .................................................. 10-095846

(51) Int. Cl.[7] .................................................. H01L 29/72
(52) U.S. Cl. .......................................... 257/295; 257/532
(58) Field of Search ...................................... 257/295, 532

(56) References Cited

U.S. PATENT DOCUMENTS

| 5,555,486 | * | 9/1996 | Kingon et al. ................ 257/295 |
| 5,566,045 | | 10/1996 | Summerfelt et al. ......... 361/321.1 |
| 5,585,300 | | 12/1996 | Summerfelt .................... 437/60 |

FOREIGN PATENT DOCUMENTS

| 195 15 347 | 11/1995 | (DE) . |
| 0 697 720 | 2/1996 | (EP) . |
| 0697720 | * 2/1996 | (EP) ................................... 257/295 |
| 2-94571 | 4/1990 | (JP) . |
| 2-232973 | 9/1990 | (JP) . |
| 4-6867 | 1/1992 | (JP) . |
| 4-206869 | 7/1992 | (JP) . |
| 6-120072 | 4/1994 | (JP) . |
| 6-125057 | 5/1994 | (JP) . |
| 8-191133 | 7/1996 | (JP) . |
| 8-191137 | 7/1996 | (JP) . |
| 9-82914 | 3/1997 | (JP) . |
| H9-330887 | 12/1997 | (JP) . |
| H10-64846 | 3/1998 | (JP) . |
| 11-87633 | 3/1999 | (JP) . |

OTHER PUBLICATIONS

Patent Abstracts of Japan, vol. 016, No. 542, published Nov. 12,1992 (corresponds to Japanese Patent Application No. 4–206869, published Jul. 28, 1992 with English Abstract).
Patent Abstracts of Japan, vol. 096, No. 005, published May 31, 1996 (corresponds to Japanese Patent Application No. 8–017822 with English Abstract).

* cited by examiner

*Primary Examiner*—Edward Wojciechowicz
(74) *Attorney, Agent, or Firm*—Sughrue, Mion, Zinn, Macpeak & Seas, PLLC

(57) ABSTRACT

A ferroelectric memory device includes a ferroelectric capacitance element formed through an insulating film on a semiconductor substrate. The ferroelectric capacitance element includes a lower electrode, a ferroelectric film formed on the lower electrode, and an upper electrode formed on the ferroelectric film. The upper electrode has a laminate structure which contains a conductive oxide layer of first metal which is connected with the ferroelectric film.

18 Claims, 16 Drawing Sheets

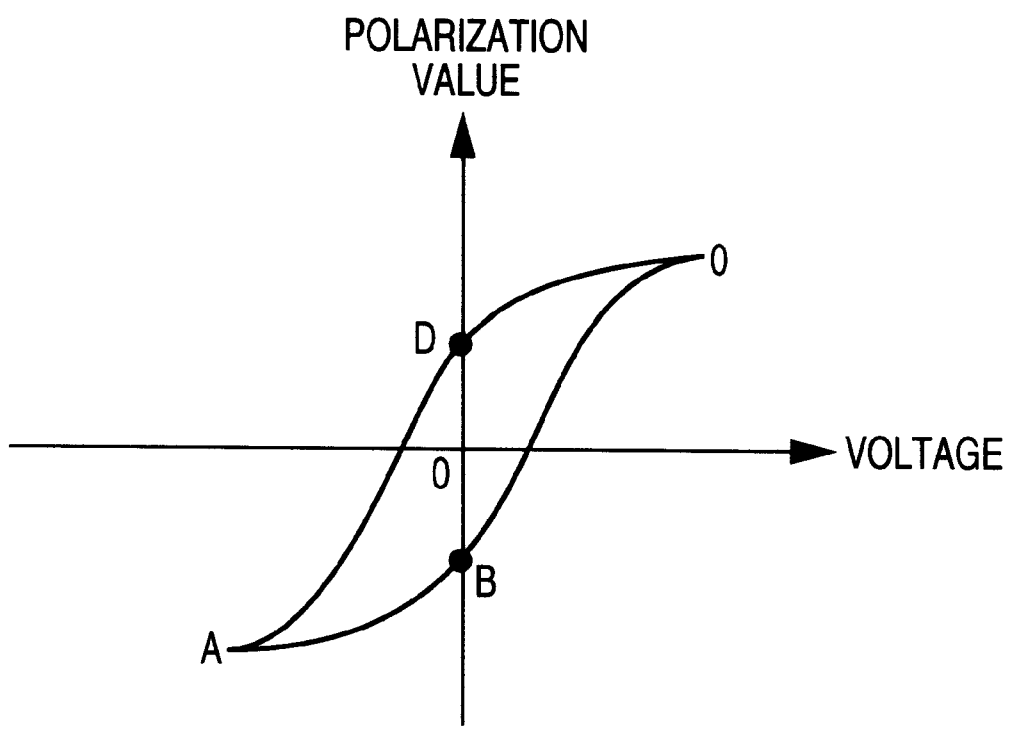

MEMORY CELL TRANSISTOR

FERROELECTRIC CAPACITANCE ELEMENT

FERROELECTRIC MEMORY DEVICE WITH IMPROVED FERROELECTRIC CAPACITY CHARACTERISTIC

BACKGROUND OF THE INVENTION

1. Field of the Invention

The present invention relates to a ferroelectric memory device and a method of manufacturing the same. More particularly, the present invention relates to a ferroelectric memory device formed on a semiconductor substrate and composed of a memory cell transistor and a ferroelectric capacitance element for holding a stored data and a method of manufacturing the same.

2. Description of the Related Art

Recent years, the technology of a ferroelectric memory device is actively per developed which uses a ferroelectric film having a spontaneous polarization characteristic as a capacity insulating film. The ferroelectric memory device uses the polarization state of the ferroelectric capacitance element formed on a semiconductor substrate to store a data.

FIGS. 1 to 4 show an example of a unit memory cell of a ferroelectric memory device. FIG. 1 is a plan view of the ferroelectric memory cell. FIG. 2 shows a cross sectional view of the ferroelectric memory cell taken along the line a–a' in FIG. 1, and FIG. 3 shows a cross sectional view of the ferroelectric memory cell taken along the line b–b' in FIG. 1. Also, FIG. 4 shows an equivalent circuit of the ferroelectric memory cell.

Referring to FIG. 4, a memory cell MC is composed of a field effect transistor Tr and a ferroelectric capacitance element Cf that is connected with one of a source and a drain of the transistor Tr. The other of the source and the drain of the transistor Tr is connected with a bit line BL. The gate electrode of the transistor Tr is connected with a word line WL. The other electrode of the ferroelectric capacitance element Cf is connected with a plate line PL. The memory cells MC structured in this way are arranged in a matrix so that a large-scaled nonvolatile ferroelectric memory device can be formed.

Next, an operation of the ferroelectric memory device will be described below.

The ferroelectric capacitance element Cf of the ferroelectric memory device shows a polarization characteristic, which depends on the history of applied voltage, as shown in FIG. 5. In FIG. 5, a positive (+) direction of the applied voltage indicates that the voltage on the side of the plate line is higher than the voltage on the side of transistor Tr.

Now, in the ferroelectric memory cell shown in FIG. 4, a voltage of Vcc, e.g., 5 V is applied to the word line WL and the bit line BL, and 0 V is applied to the plate line PL. At that time, the ferroelectric capacitance; element Cf is set to the state shown in FIG. 5 by a polarization state A. In this state, when only the voltage of the bit line BL is decreased to 0 V, the ferroelectric capacitance element Cf changes into the polarization state B shown in FIG. 5. When this polarization state is made to correspond to "1", it means that "1" is written in the memory cell MC. Also, when the voltage Vcc is applied to the word line WL and the plate line PL, and when 0 V is applied to the bit line BL, the ferroelectric capacitance element Cf changes into the polarization state C shown in FIG. 5. When the voltage applied to the plate line PL is decreased from this state to 0 V, the ferroelectric capacitance element Cf changes into the polarization state D shown in FIG. 5. For example, this means that "0" is written in the memory cell. It is preferable that the polarization state D in the application voltage of 0 V, i.e., the difference in a polarization value between the state D and state B (to be referred to as a residual polarization) is large. As a result, the reliability of data holding characteristic and rewriting weariness tolerance as the ferroelectric memory device can be achieved.

Next, the structure of this memory cell will be described.

FIG. 2 shows the cross sectional view of the memory cell taken along the line a–a' of FIG. 1, and FIG. 3 shows the cross sectional view of the memory cell taken along the dotted line b–b' of FIG. 1. As shown in FIGS. 1 to 3, the source/drain $n^+$ diffusion layers 8 are formed in surface regions of a p-type silicon substrate 1. A gate electrode 7 is formed through a gate insulating film (not illustrated) on the p-type silicon substrate 1. Thus, the field effect transistor as a memory cell transistor Tr is formed.

The bit line BL 6 mainly composed of Al is connected with one of the source and drain diffusion layers 8 of the field effect transistor Tr. A ferroelectric capacitance element Cf which is composed by a lower electrode 3, a ferroelectric film 4 and an upper electrode 5 is formed on the field effect transistor Tr through an interlayer insulating film ($SiO_2$). The upper electrode 5 is connected with one of the source and drain diffusion layers 8 of the field effect transistor Tr by a wiring layer 10. In the conventional example, the word line WL 7 is used as the gate electrode of the field effect transistor Tr, and the plate line PL 3 is used as the lower electrode 3 of the ferroelectric capacitance element Cf. The ferroelectric film 4 is formed of a substance such as PZT ($PbZr_xTi_{1-x}O_3$) and SBT($SrBi_2Ta_2O_9$).

A ferroelectric film is generally formed in an oxidizing ambience. Also, an annealing process in an oxygen ambience often becomes necessary because of the stabilization of the ferroelectric film after the ferroelectric film is formed. For this reason, oxidization resistant noble metal such as Pt and Ir or a conductive oxide such as $IrO_2$ and $RuO_2$ are used as the lower electrode 3 and the upper electrode 5. The wiring layers 6 and 10 are required to have the easiness of fine pattern formation, the excellent fitness to Si and $SiO_2$, and a low resistivity. For example, a multi-layer film formed of Ti, TiN and Al is used as the wiring layer. Because Al has the fine pattern formability, corrosion resistance property, and a low resistivity, Al is widely used as the wiring layer material.

However, when Al and Si contact in the diffusion layer, Si atoms diffuse into the Al wiring layer in heat treatment to sometimes destroy the PN junction between the diffusion layer and the Si semiconductor substrate. For this reason, a TiN film is often used as a barrier film to prevent the mutual diffusion of the Al atoms and the Si atoms. Also, a Ti film is formed under the TiN film. Thus, for example, a laminate layer in which the Ti film, the TiN film and the Al film are laminated in this order from the bottom to form the multi-layer wiring layer. This is because the TiN film is inferior in the fitness with the Si film or the $SiO_2$ film so that a contact resistance with the Si film or the $SiO_2$ film is high.

Also, it is necessary to achieve a good electric connection between the Al film of the wiring layer 10 and a noble metal film, such as a Pt film which is used for the lower electrode 3 and the upper electrode 5. Therefore, the technique in which a barrier layer which contains Ti as a main component is provided between the Al film and the Pt film is described in Japanese Laid Open Patent Application (JP-A-Heisei 6-120072).

Next, a manufacturing method of the ferroelectric memory cell of the conventional example shown in FIG. 4 will be described with reference to the drawings. FIGS. 6A to 6C show cross sectional views of the conventional memory cell in the manufacturing process of the conventional memory cell.

As shown in FIG. 6A, a ferroelectric capacitance element Cf is composed of a lower electrode 3, a ferroelectric film 4 and an upper electrode 5. The ferroelectric capacitance element Cf is formed on an interlayer insulating film which is formed on a silicon substrate 1, in which a semiconductor integrated circuit such as memory cell transistors Tr is embedded. A protecting film is formed on the ferroelectric capacitance element Cf.

Next, as shown in FIG. 6B, contact holes 21 and 22 are formed to reach the upper electrode 5 of the capacitance element Cf and the diffusion layer 8 of the field effect transistor Tr.

Next, as shown in FIG. 6C, a wiring layer 10 and a bit line 6 are formed to electrically connect the upper electrode 5 of the capacitance element Cf and the diffusion layers of the field effect transistor Tr. After that, heat treatment is performed at the temperature equal to or higher than 300° C. This heat treatment is an essential process for reduction of a contact resistance of the transistor Tr and stabilization of a threshold voltage.

However, the residual polarization value of the ferroelectric film decreases remarkably when the above heat treatment is performed. Also, a storage data holding characteristic and data rewrite lifetime necessary for the nonvolatile memory degrade remarkably. As for these causes, it is not clear yet. However, it could be considered as the causes that titanium atoms as a wiring layer material diffuse into the ferroelectric film to react with the ferroelectric film, or the polarization characteristic of the ferroelectric film changes due to the temperature stress by the wiring layer material.

Also, a similar problem occurs when a protecting film is formed on the memory cell MC which has the structure shown in FIGS. 1 to 3. That is, the ferroelectric capacitance element Cf is degraded so that the reliability of the ferroelectric memory device decreases remarkably, when a silicon nitride film ($Si_3N_4$) is formed by a plasma CVD method at the substrate temperature from about 300° C. to about 400° C.° C., as performed in the conventional example.

Therefore, there becomes a problem how the structure of the ferroelectric memory device, and the upper electrode of the ferroelectric capacitance element Cf and the lower electrode thereof should be formed.

As the electrode material of the ferroelectric memory device, various materials are used in the relation to a structure and a manufacturing method.

In Japanese Laid Open Patent Application (JP-A-Heisei 2-94571), for example, a gate electrode functions as an upper electrode and tungsten (W) is used for the gate electrode as the electrode material.

Also, it is described in Japanese Laid Open Patent Application (JP-A-Heisei 4-206869) that a conductive oxide film is used which contains transition metal as one of main components in an upper electrode and a lower electrode.

In Japanese Laid Open Patent Application (JP-A-Heisei 4-6867), a silicon oxide film and a silicon nitride film are used between a lower electrode and a diffusion layer to improve the break down voltage. In this example, the lower electrode is composed of platinum (Pt) and the upper electrode is composed of polysilicon.

In Japanese Laid Open Patent Application (JP-A-Heisei 2-232973), a silicide film which contains a high melting point metal as a main component is formed on the surface on a diffusion layer and it is used as a lower electrode. An upper electrode is formed of aluminum (Al).

Moreover, in Japanese Laid Open Patent Application (JP-A-Heisei 9-82914) is described a ferroelectric memory device in which a plug and a lower electrode are formed as a unit to prevent a lower portion of the plug from being oxidized through a barrier layer to become high resistance. In this conventional example, Ti, TiN, Pt, Ru Ir, and an alloy containing them, or a conductive oxide of Ru or Ir is used for a barrier layer. Also, Pt, Ru and Ir, an alloy containing them, or a conductive oxide of Ru or Ir is used for a plug used as a lower electrode. There is no explanation as for an upper electrode. Also, a wiring layer is composed of aluminum alloy and is formed on the upper electrode through an interlayer insulating film.

SUMMARY OF THE INVENTION

An object of the present invention is to provide a ferroelectric memory device in which degradation of a ferroelectric capacitance element due to a heating process after a wiring layer is formed is restrained.

Another object of the present invention is to provide a ferroelectric memory device in which it is possible to improve the reliability of storage data holding characteristic and data rewrite lifetime.

Still another object of the present invention is to provide a method of manufacturing the above ferroelectric memory device.

In order to achieve an aspect of the present invention, a ferroelectric memory device includes a ferroelectric capacitance element formed through an insulating film on a semiconductor substrate. The ferroelectric capacitance element includes a lower electrode, a ferroelectric film formed on the lower electrode, and an upper electrode formed on the ferroelectric film. The upper electrode has a laminate structure which contains a conductive oxide layer of first metal which is connected with the ferroelectric film.

The first metal is preferably iridium (Ir), and the conductive oxide layer is preferably an iridium oxide ($IrO_2$) layer. In this case, the laminate structure of the upper electrode is preferably formed of the conductive oxide layer and a layer of iridium or platinum. Also, it is preferable that a top layer of the laminate structure of the upper electrode connected to a wiring layer is a layer of iridium or platinum.

The ferroelectric memory device may further include a wiring layer formed on the ferroelectric capacitance element through an insulating film, and connected with the upper electrode, and a bottom layer of the wiring layer may be formed of a tungsten layer or a metal silicide layer. In this case, the bottom layer of a portion of the wiring layer within 2 gm from the upper electrode is formed of a tungsten layer or a metal silicide layer. Also, the wiring layer may be formed of a titanium nitride layer and an alloy layer containing aluminum and laminated on the tungsten layer or the metal silicide layer. In addition, the metal silicide layer is preferably a tungsten silicide (WSix) layer.

In order to achieve another aspect of the present invention, a ferroelectric memory device, include a ferroelectric capacitance element formed through a first insulating film on a semiconductor substrate, and a wiring layer formed on the ferroelectric capacitance element through a second insulating film. The ferroelectric capacitance element includes a lower electrode, a ferroelectric film formed on the lower electrode, and an upper electrode formed on the ferroelectric film and connected to the wiring layer. The wiring layer has a laminate structure having one of a tungsten layer or a metal silicide layer as a bottom layer.

In order to achieve still another aspect of the present invention, a method of manufacturing a ferroelectric memory device, includes:

forming through an insulating film on a semiconductor substrate, a ferroelectric capacitance element which is composed of a lower electrode, a upper electrode, and a ferroelectric film which is sandwiched between the upper electrode and the lower electrode;

forming a protecting film on the ferroelectric capacitance element;

providing a contact hole in the protecting film to pass through the upper electrode; and forming a metal silicide layer or a tungsten layer in the contact hole and on the protecting film.

BRIEF DESCRIPTION OF THE DRAWINGS

FIG. 5 is a graph illustrating the polarization characteristic of a ferroelectric substance;

DESCRIPTION OF THE PREFERRED EMBODIMENTS

Next, the ferroelectric memory device of the present invention will be described with reference to the attached drawings.

Figure 7:
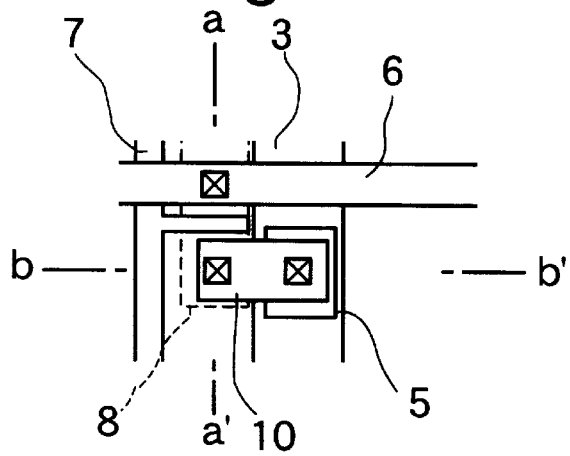
FIG. 7 is a plan view illustrating the structure of a ferroelectric memory device of the present invention.
Figure 8:
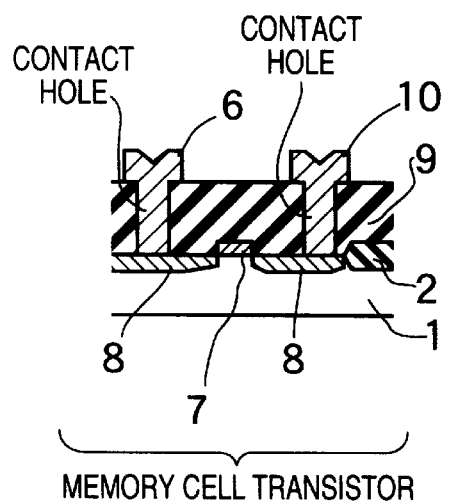
FIG. 8 is a cross sectional view of the ferroelectric memory device taken along the line a–a' of FIG. 7.
Figure 9:
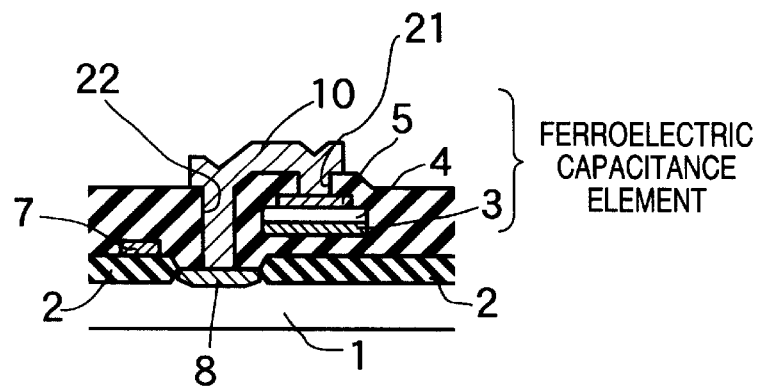
FIG. 9 is a cross sectional view of the ferroelectric memory device taken along the line b–b' of FIG. 7.

FIG. 7 shows a plan view of the ferroelectric memory device according to the first embodiment of the present invention. FIG. 8 shows a cross sectional view of the ferroelectric memory device taken along the line a–a' at FIG. 7, and FIG. 9 shows a cross sectional view of the ferroelectric memory device taken along the line b–b' at FIG. 7.

The ferroelectric memory device is composed of a semiconductor substrate 1, a memory cell transistor Tr and a ferroelectric capacitance element Cf which are provided on and above the semiconductor substrate 1, and a protecting film 9 of $SiO_2$ which is provided on the ferroelectric capacitance element Cf.

The ferroelectric capacitance element Cf is composed of a lower electrode 3, an upper electrode 5 and a ferroelectric film 4 which is sandwiched by them. A contact hole is formed in the protecting film 9 to pass through to the upper electrode 5. The ferroelectric capacitance element Cf and the memory cell transistor Tr are electrically connected to a wiring layer 10 through the contact hole. The bit line in this embodiment is formed by the wiring layer 6 as shown in FIG. 7 and FIG. 8.

In this embodiment, the wiring layer 6 as the bit line and the wiring layer 10 connected with the upper electrode 5 are composed of a metal silicide layer such as a tungsten silicide (WSix) layer. Instead, the wiring layers 6 and 10 may have a laminate structure which is composed of the metal silicide layer and a layer containing aluminum (Al) or titanium nitride (TiN) as a main component on the metal silicide layer. Otherwise, the wiring layers 6 and 10 may be composed of a tungsten (W) layer or may have a laminate structure which is composed of the tungsten (W) layer and a layer containing aluminum (Al) or titanium nitride (TiN) as a main component on the tungsten (W) layer.

As mentioned above, the property to be required as the upper electrode 5 of ferroelectric capacitance element Cf is different from that of the wiring layer 10. Therefore, the same material cannot be used for the upper electrode 5 and the wiring layer 10. For the purpose of stabilization of the interface between the upper electrode 5 and the wiring layer 10 and attainment of a good capacity characteristic, it is preferable that the upper electrode 5 is composed of $IrO_2$ or Ir as a main component. WSix is preferable as the metal silicide for the wiring layer 10 in restraint of the degradation of the ferroelectric capacitance element Cf due to the heating after wiring layer is formed, in the fitness to $SiO_2$ and in the reduction of a contact resistance with Si.

In order to use Al having a low resistivity for the wiring layer, it is desirable that a TiN layer is used as a barrier film between an Al layer and a Si layer, and a WSix layer is used for a lower layer under the TiN layer. That is, the wiring structure composed of the WSix layer, the TiN layer, the Al layer and the TiN layer from the bottom is desirable for the wiring layer. The TiN layer as the top layer is a reflection preventing film. By adopting a combination of the upper electrode 5 and the wiring layer 10, the degradation of the ferroelectric capacitance element Cf due to the heat treatment after the wiring layers 6 and 10 are formed can be restrained.

Next, a manufacturing method of the ferroelectric memory device in this embodiment will be described using the process cross sectional views shown in FIGS. 10A to 10C and 11A to 11C.

Figure 10A:
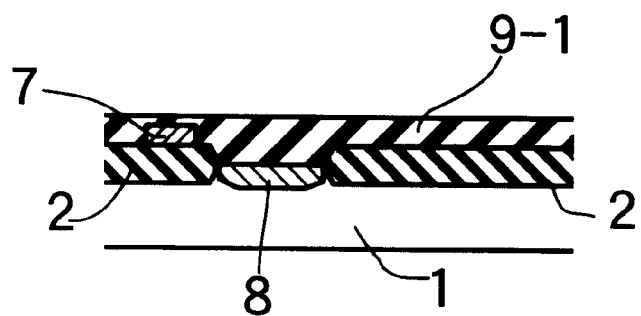
FIGS. 10A to 10C and 11A to 11C are cross sectional views of the ferroelectric memory device in a manufacturing process of the present invention.

As shown in FIG. 10A, after the memory cell transistor Tr is formed by the same process as a manufacturing process of a usual MOS transistor, a silicon oxide film 9-1 is formed as the first interlayer insulating film.

Figure 10B:
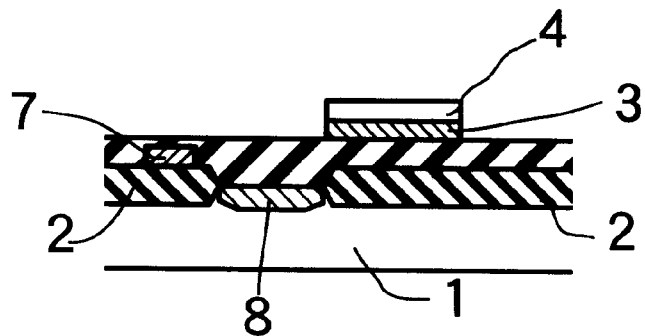
Figure 10C:
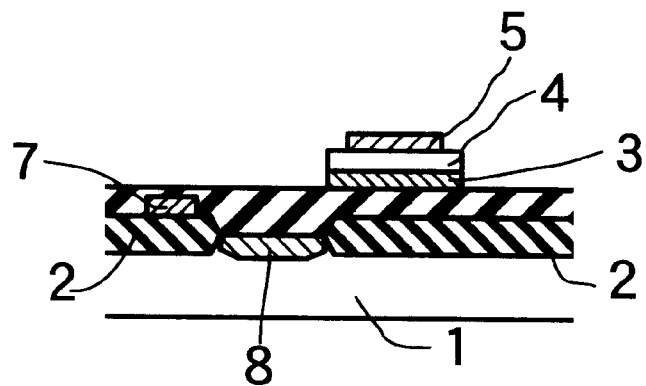

As shown in FIG. 10B, thereafter, the ferroelectric capacitance element Cf is formed by the following method. First, the lower electrode 3 is formed on the silicon oxide film 9-1, and then the ferroelectric film 4 is formed on the lower electrode 3. The material used for the lower electrode 3 is noble metal such as Pt, Ir and Ru or a conductive oxide such as $IrO_2$ and $RuO_2$ and is generally formed by a sputtering method. $PbZr_xTi_{1-x}O_3$ or $SrBi_2Ta_2O_9$ is preferable as a ferroelectric film material because the residual polarization which is necessary to operate as the ferroelectric memory device is attained at the normal temperature. $PbZr_xTi_{1-x}O_3$ or $SrBi_2Ta_2O_9$ is formed by a sputtering method, a sol-gel method and a CVD method. After that, as shown in FIG. 10C, the upper electrode 5 of the capacitance element Cf is formed by a sputtering method.

Figure 11A:
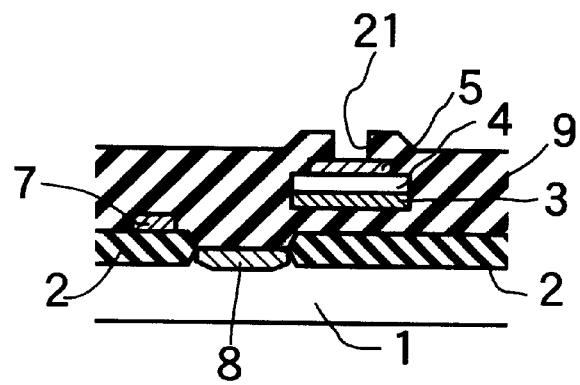

Next, as shown in FIG. 11A, after an insulating film such as a silicon oxide film is deposited to from the protecting film 9, a contact hole 21 is formed to pass through to the upper electrode 5.

Figure 11B:
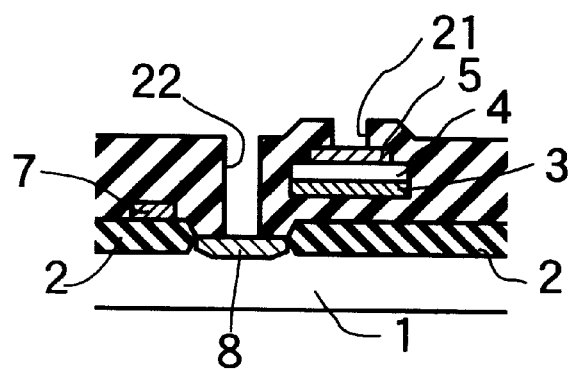
Figure 11C:
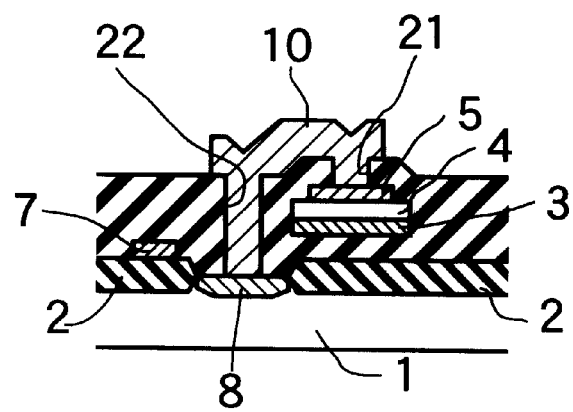

Moreover, as shown in FIG. 11B, a contact hole 22 is formed to pass through to the diffusion layer.

Next, a metal silicide layer or a tungsten (W) layer is formed by a method such as a sputtering method and a CVD method as the wiring layer 10. Then, the wiring layer is patterned. Instead, a layer containing aluminum (Al) or titanium nitride (TiN) as a main component may be deposited on a metal silicide layer or a tungsten (W) layer by a sputtering method or a CVD method to form a laminate layer. Then, the wiring layer 10 is patterned. At this time, the wiring layer 6 may be formed at the same time.

After that, an annealing process is performed at the temperature in a range from 300° C. to 500° C. for the characteristic of the MOS transistor Tr, as described above.

Figure 27:
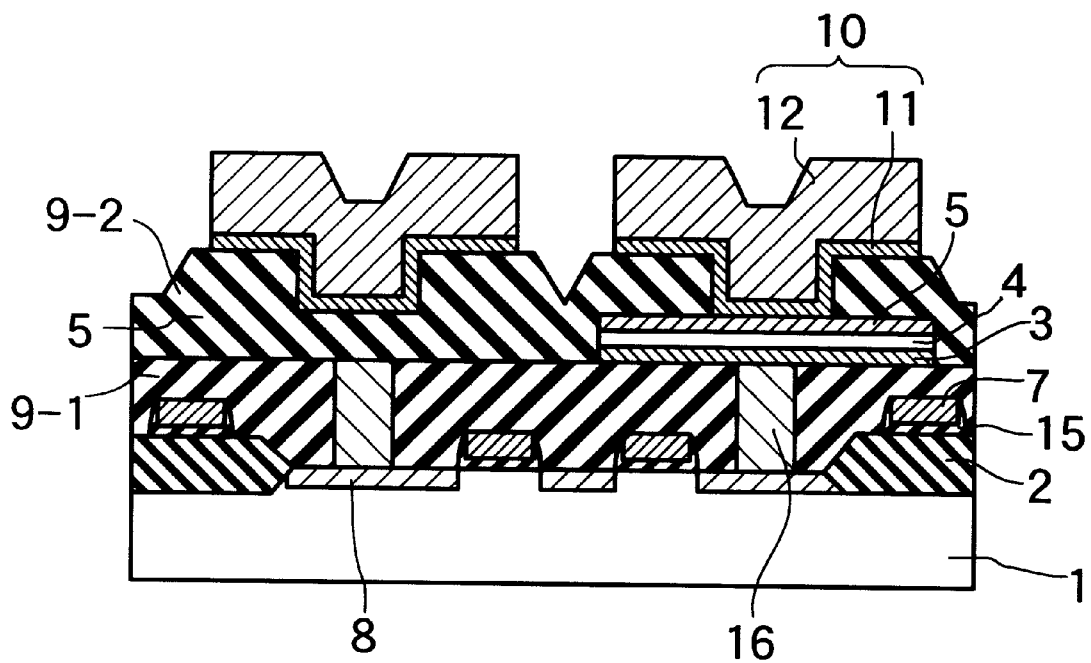
FIG. 27 is a cross sectional view illustrating a specific example of the ferroelectric memory device according to the present invention.

FIG. 27 shows a cross sectional view of the ferroelectric memory device according to the second embodiment of the present invention. In this embodiment, a lower electrode 3 of the ferroelectric capacitance element Cf is connected with the diffusion layer 8 through a polysilicon plug 16. An upper electrode 5 is connected with the wiring layer 10, which functions as the plate line. The wiring layer 10 is composed of a metal silicide layer 11 and a layer 12 in which an Al layer and a TiN layer are laminated. A WSix layer is preferable as the metal silicide layer. This is because the WSix layer can restrain the degradation of the ferroelectric capacitance element due to the heat treatment after the wiring layer 6 is formed, and can improve the fitness with $SiO_2$ and can reduce a contact resistance with a Si layer. As the upper electrode 5, an Ir layer or a laminate structure, in which an $IrO_2$ layer and an Ir layer or a Pt layer from the bottom layer are laminated, is preferable. This is because a stable interface can be formed between the upper electrode 5 and the wiring layer 10, so that a good capacity characteristic is attained.

By adopting such a structure, even if heat treatment is performed after the wiring layer 10 is formed, the capacity characteristic never degrades. Also, compared with the first embodiment, the cell area can be reduced and the Al layer having a low resistance can be used as the plate line. Therefore, it is possible to increase the operation speed.

The ferroelectric memory device of the present invention will be described below in detail. However, the present invention is not limited to this.

FIG. 7 is a plan view of the ferroelectric memory device according to the first embodiment of the present invention. FIG. 8 shows a cross sectional view of the ferroelectric memory device taken along the line a–a' of FIG. 7, and FIG. 9 shows a cross sectional view of the ferroelectric memory device taken along the line b–b' of FIG. 7.

The ferroelectric capacitance element Cf is formed to have the lower electrode 3 the ferroelectric film 4 and the upper electrode 5. The lower electrode 3 is formed on the interlayer insulating film 9 formed on the field effect transistor Tr which is formed on the semiconductor substrate, and composed of a Ti layer and a Pt layer from the bottom layer. The ferroelectric film 4 is composed of a PZT layer. The upper electrode 5 is composed of an $IrO_2$ layer and an Ir layer in order from the bottom layer. The reason why the Ir layer is laminated on the $IrO_2$ layer is to prevent that the wiring layer material which contacts the upper electrode 5 is oxidized by $IrO_2$ so that the contact resistance between the upper electrode 5 and the wiring layer 10 increases.

The contact holes are formed to pass through to the upper electrode 5 of the ferroelectric capacitance element Cf and the diffusion layer 8 of the field effect transistor Tr for electrically connecting the field effect transistor Tr and the ferroelectric capacitance element Cf. The upper electrode 5 of the ferroelectric capacitance element Cf and one diffusion layer 8 of the field effect transistor Tr are electrically connected by the wiring layer 10 through the contact hole. Also, the other diffusion layer 8 of the field effect transistor Tr is connected with the wiring layer 6 as the bit line through the other contact hole.

As the material of the wiring layer 10, $WSi_{2.4}$, TiN, Al, TiN are used in order from the bottom. The TiN layer as the second layer from the bottom layer is the barrier film to prevent the mutual diffusion of Al and Si. The $WSi_{2.4}$ layer is excellent in the fitness with $SiO_2$ such that the contact resistance with Si can be reduced. The TiN layer as the top layer is a reflection preventing film.

The method of manufacturing the ferroelectric memory device in this embodiment will be described while referring to FIGS. 10A to 10C.

As shown in FIG. 10A, the field effect transistor Tr is formed in accordance with the manufacturing process of a conventional LSI (Large Scale Integrated Circuit) to be composed of a gate electrode 7 and diffusion layers 8 on a p-type semiconductor substrate 1. The $SiO_2$ interlayer insulating film 9-1 is deposited on the whole of semiconductor substrate by an LPCVD (Low Pressure Chemical Vapor Deposition) method. Then, a semiconductor substrate surface is flattened by the CMP (Chemical Mechanical Polishing) method.

As shown in FIG. 10B, the Ti layer having the film thickness of 20 nm is deposited as the fitting layer between the lower electrode 3 and the $SiO_2$ interlayer insulating film, and then the Pt layer having the film thickness of 200 nm is deposited as the lower electrode 3 by a DC sputtering method. After that, the PZT film 4 is formed to have the film thickness of 300 nm by a sol-gel method. Mixture solution of $Pb(CH_3COO)_2$, $Zr(OC_2H_5)_4$ and $Ti(i-OC_3H_7)_4$ is used as the start raw materials of the PZT film. The mole ratio of Pb:Zr:Ti of the mixture solution is 1.15:0.53:0.47, and the concentration of Pb in the mixture solution is 0.6 mol/l. After the mixture solution is spin-coated on the Pt layer, a drying process is performed for 15 minutes at 250° C. in a nitrogen ambience. Moreover, a baking process is performed for 10 minutes at 600° C. in an oxygen ambience. The processes from the spin coating process to the baking process are repeated three times, the PZT film can be formed to have the film thickness of 300 nm. After that, a PZT/Pt/Ti laminate layer (it shows that the Ti layer, the Pt layer and the PZT layer are laminated in order from the bottom and hereinafter, it is similar) is patterned to form the lower electrode 3 using a photoresist as a mask.

After that, as shown in FIG. 10C, an $IrO_2$ layer with the film thickness of 150 nm and an Ir layer with the film thickness of 50 nm are laminated in this order and the $Ir/IrO_2$ laminate layer is patterned using a photoresist film as a mask to produce the upper electrode 5.

Next, as shown in FIG. 11A, a $SiO_2$ interlayer insulating film is deposited as a part of the protecting film 9 on the semiconductor substrate surface by an $O_3$-TEOSCVD method to have the film thickness of 400 nm. The contact hole 21 is formed to pass through to the upper electrode 5 of the ferroelectric capacitance element Cf by an RIE (Reactive Ion Etching) method using of a $CF_4$ gas as an etching gas and using a photoresist film as a mask.

As shown in FIG. 11B, after the contact hole 21 is formed, an annealing process is performed for 10 minutes at 600° C. in an oxygen ambience so that the damage which is caused in the ferroelectric capacitance element Cf at the time of etching of the contact hole 21 can be removed. Subsequently, a contact hole 22 is formed to pass through to the diffusion layer 8 of the transistor Tr by the RIE method using a $CHF_3$ gas as the etching gas.

After that, a $WSi_{2.4}$ film is deposited by a DC sputtering method for the wiring layers 6 and 10 to have the film thickness of 50 nm. The Ir film formed as the upper electrode 5 is hardly oxidized even if the annealing process is performed at about 600° C. in the oxygen ambience. However, the surface of the Ir layer is a little oxidized. Because Ir is conductive even if it is oxidized, the oxidized Ir itself does not function to cause a contact conductive fault. However, when the Ir layer surface of the upper electrode 5 is oxidized through the annealing process, a $WSi_{2.4}$ layer as the wiring layer 10 in contact with the Ir layer is oxidized by the heat treatment in the subsequent process. As a result, the $Ir/WSi_{2.4}$ layer interface resistance becomes high. Therefore, it is preferable that the Ir layer surface is etched by a dry etching using a $CHF_3$ gas as a reactive gas before the $WSi_{2.4}$ layer is deposited. As a result, the above problem can be avoided. A target composition of WSix in this embodiment was $WSi_{2.7}$ but the composition of the deposited WSix layer was $WSi_{2.4}$.

Figure 1:
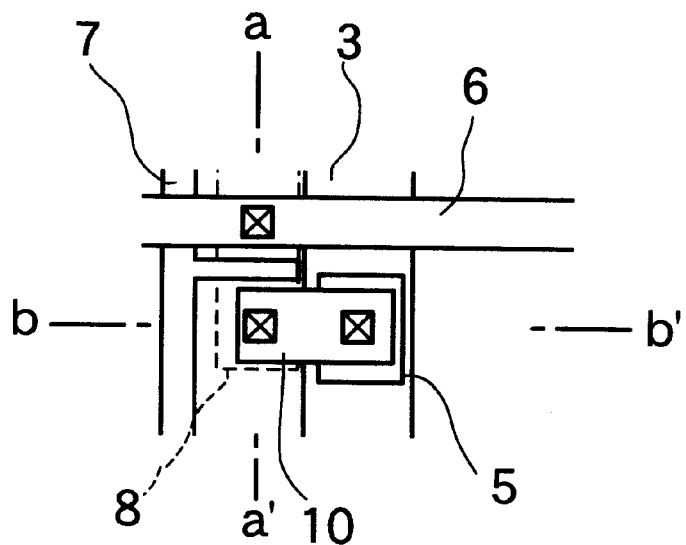
FIG. 1 is a plan view illustrating a conventional ferroelectric memory device.
Figure 2:
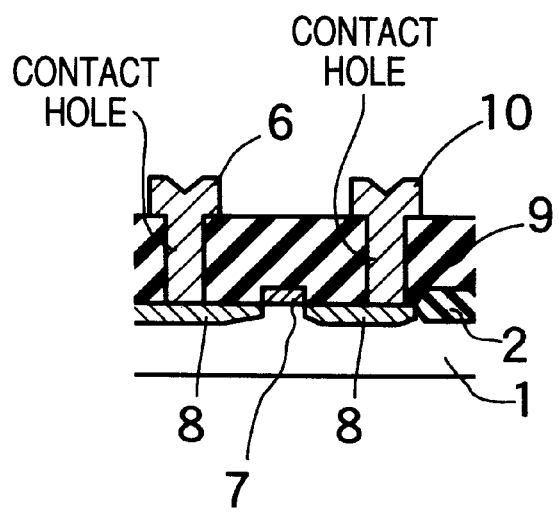
FIG. 2 is a cross sectional view of the ferroelectric memory device taken along the line a–a' of FIG. 1.
Figure 3:
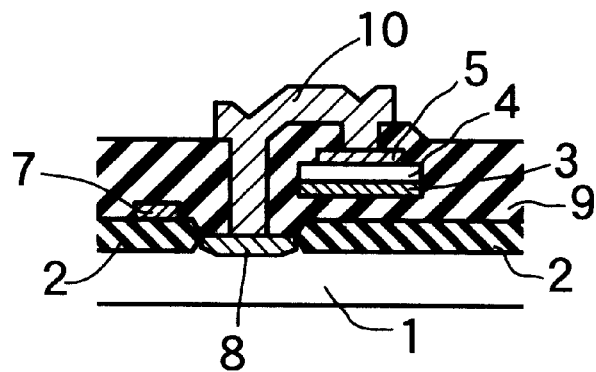
FIG. 3 is a cross sectional view of the ferroelectric memory device taken along the line b–b' of FIG. 1.
Figure 4:
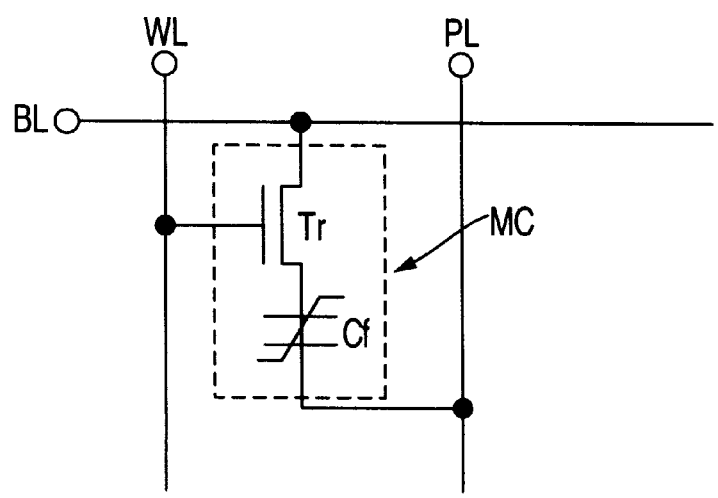
FIG. 4 is a circuit diagram illustrating an equivalent circuit of the ferroelectric memory device of FIG. 1.
Figure 6A:
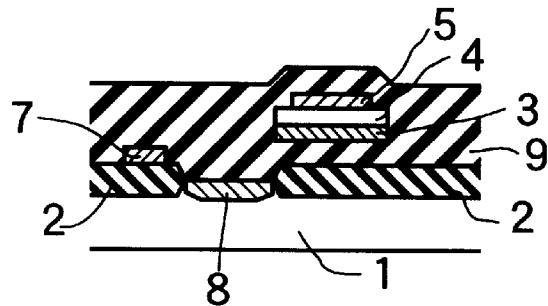
FIGS. 6A to 6C are cross sectional views of the conventional ferroelectric memory device in a manufacturing process.
Figure 6B:
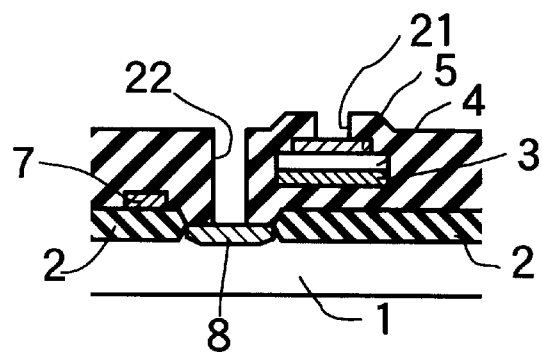
Figure 6C:
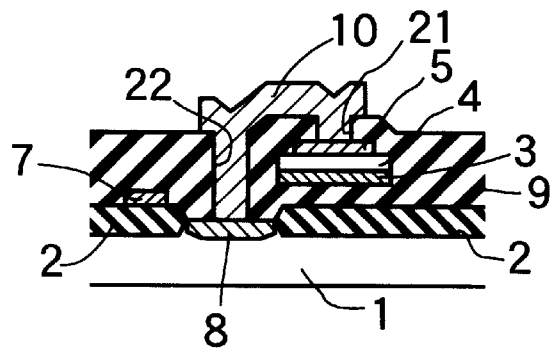

Subsequently, as shown in FIG. 1C, a reactive sputtering process of Ti is performed using a mixture gas of an Ar gas and a $N_2$ gas, a TiN layer is deposited to have the film thickness of 100 nm. Moreover, an Al layer with the film thickness of 550 nm and an TiN layer with the film thickness of 30 nm as the reflection preventing film are deposited in this order. Subsequently, the wiring layer 10 is patterned by an RIE method using a $Cl_2$ gas as the etching gas and using a photoresist film as a mask.

Figure 12:
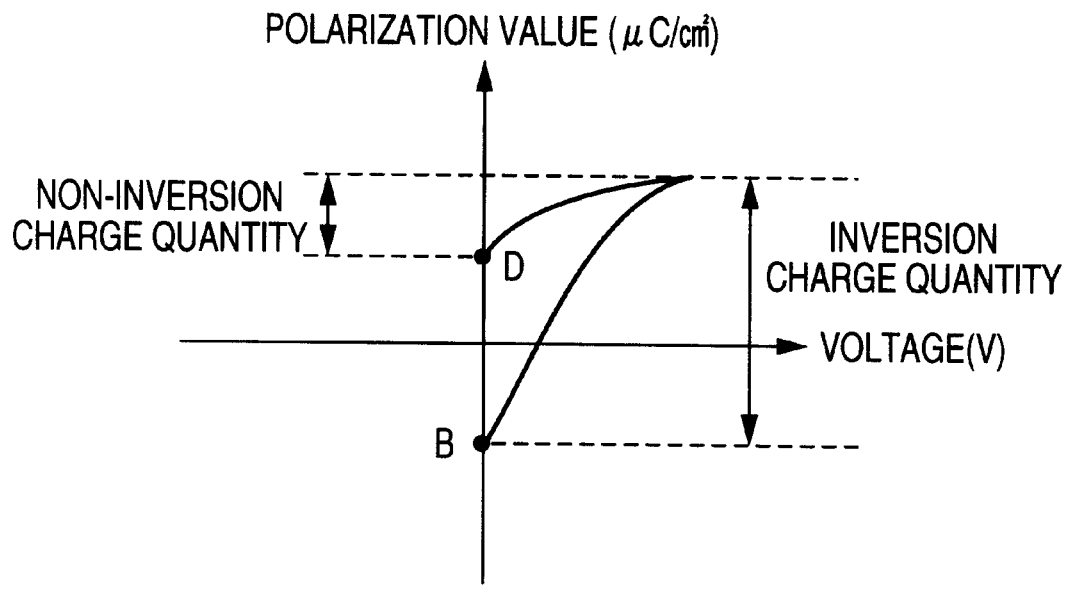
FIG. 12 is a graph illustrating the polarization characteristic of a ferroelectric substance.

The inventors performed an annealing process to the ferroelectric memory device in which the wiring layers were formed in this way, for 30 minutes at 400° C. in a nitrogen ambience, and measured the change of the switching charge in the PZT capacity before and after the annealing process. The switching charge means an inversion charge quantity and a non-inversion of the ferroelectric capacitance element Cf, as shown in FIG. 12. The storage data holding characteristic of the ferroelectric memory device is excellent when the residual polarization value which is a difference between the inversion charge quantity and the non-inversion charge quantity is large. Therefore, the large residual polarization value would be possible to say to be a desirable characteristic for the ferroelectric capacitance element Cf.

Figure 13:
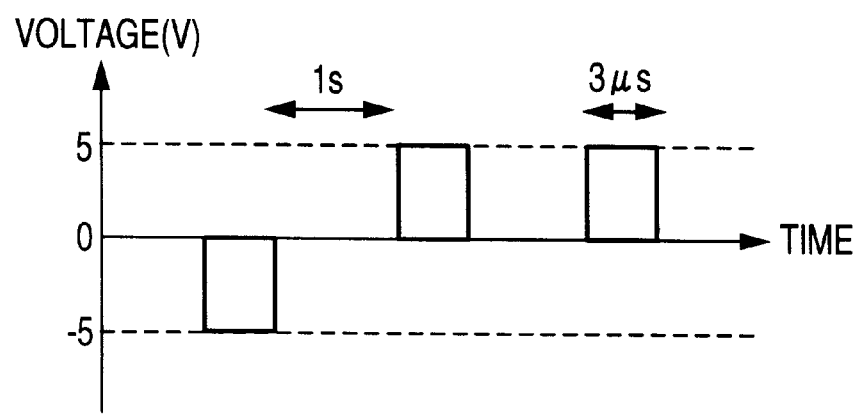
FIG. 13 is a diagram illustrating a voltage pulse sequence used for measurement experiment on the polarization characteristic of the ferroelectric substance.

The switching charge was measured by applying a pulse sequence as shown in FIG. 13 between the upper electrode 5 and the lower electrode 3 in the ferroelectric capacitance element Cf. The ferroelectric capacitance element Cf was set to the polarization state of B in FIG. 12 in response to the first pulse, and set to the polarization state of D in response to the second pulse. At the same time, the inversion charge quantity was measured. Then, by applying the third pulse, the non-inversion charge quantity was measured. The application pulse duration was 3 $\mu$s and the pulse interval was 1 s. The PZT capacity Cf used for the measurement had the top electrode 5 with the square size of 3 $\mu$m in horizontal and 3 $\mu$m in vertical. About 1000 samples having the same size were arranged in parallel to diminish the influence of noise, and then measurement was performed. The difference between the inversion charge quantity and the non-inversion charge quantity in the PZT capacitance element Cf, i.e., the residual polarization value before and after the annealing process was measured at five points on the wafer surface.

Figure 14:
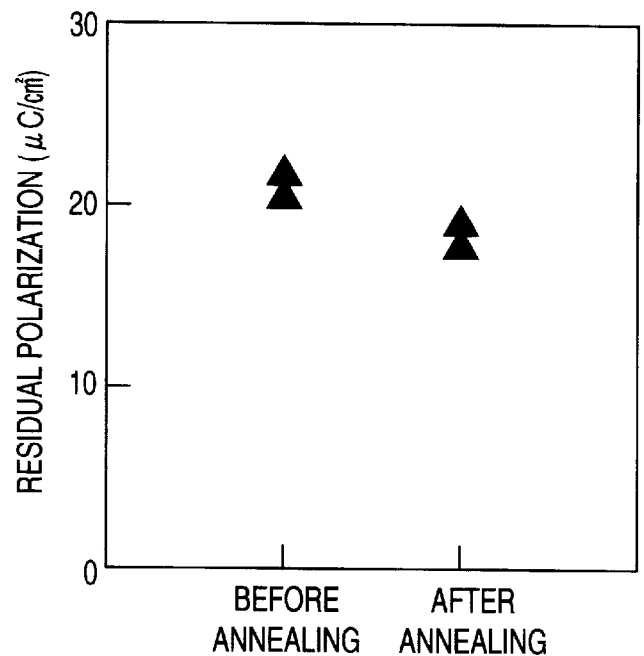
FIG. 14 is a diagram illustrating the change in residual polarization characteristic of the ferroelectric memory device according to an embodiment of the present invention before and after an annealing process.

The measuring result is shown in a vertical axis in FIG. 14. As shown in FIG. 14, there is rather not a change in the residual polarization value too much before and after the annealing process, and it shows the large value of about 19 $\mu C/cm^2$.

Figure 15:
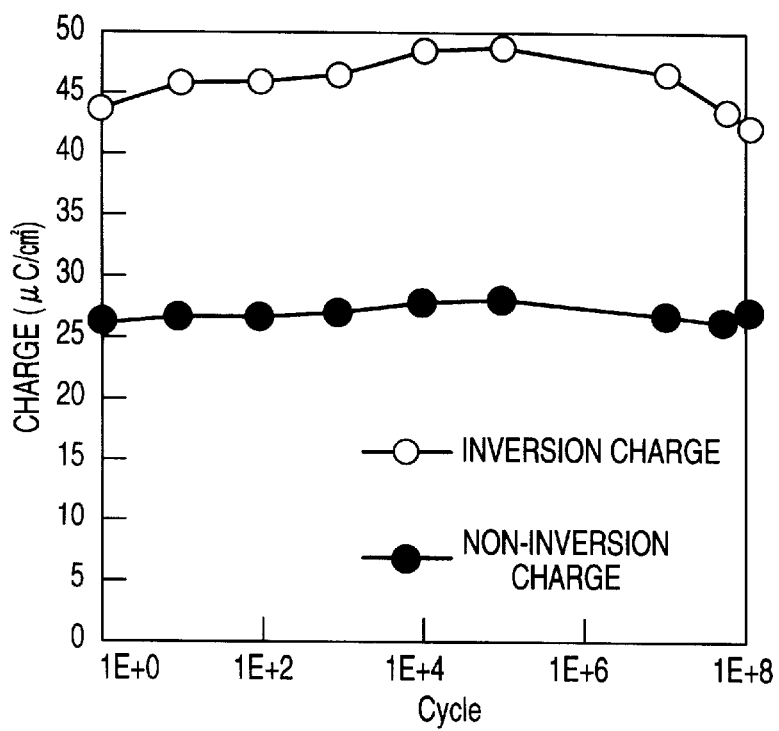
FIG. 15 is a diagram illustrating degradation of the ferroelectric memory device according to the embodiment of the present invention.

Also, FIG. 15 shows the measuring result of a characteristic of weariness of the above capacitance element after the annealing. The weariness characteristic was measured by applying square wave pulses during the predetermined number of cycles and then by measuring the switching charge after each cycle. As shown in FIG. 15, the weariness characteristic is good even after the annealing process. The decrease of the residual polarization after $10^8$ cycles is only equal to or less than 15% of the initial value.

Moreover, the contact resistance between the wiring layer 10 and each of the upper electrodes 5, the lower electrodes 3, and the diffusion layer 8 after the annealing process was measured. The measured contact resistances having the size of 0.8 $\mu$m×0.8 $\mu$m are all equal to or less than 10 Ω to indicate a good characteristic.

On the other hand, conventional PZT capacitance elements Cf were prepared to have the conventional wiring layer 10 of the structure of TiN/Al/TiN/Ti, unlike the present invention which has the wiring layer 10 with the structure of TiN/Al/TiN/WSix. The residual polarization values of the conventional PZT capacitance elements Cf after the wiring layers 10 were formed were measured before and after the annealing process.

Figure 16:
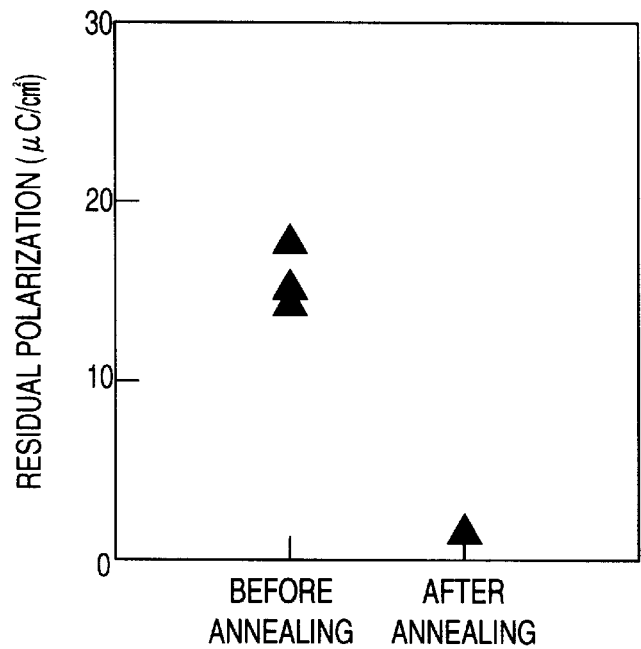
FIG. 16 is a diagram illustrating the change in residual polarization characteristic of a conventional ferroelectric memory device before and after an annealing process.

The measuring results are shown in FIG. 16 in a vertical axis. In case of the wring layer 10 with the structure of TiN/Al/TiN/Ti, the residual polarization value after the annealing process decreases remarkably to less than 1 $\mu C/cm^2$, as shown in FIG. 16. That is, it is conspicuous that the characteristic as the ferroelectric capacitance element is degraded.

The cause of such degradation in case of using the conventional wiring structure is not yet clear. However, the following causes could be mainly considered. That is, impurities such as Ti atoms and Al atoms contained in the wiring layer or the wiring layer material diffuse into the PZT film through the annealing process, and chemically react with PZT to change the crystal structure of the PZT film. Or, the crystal structure of the PZT film changes due to the temperature stress which is caused by the wiring layer through the heat treatment. Therefore, it could be considered that the WSix layer used in the present invention prevents the diffusion of the wiring layer material and releases the film stress. Even if the WSix layer has either of the effect to prevent the diffusion of the wiring layer material or the effect to release the film stress, the WSix layer must be formed as the bottom layer in the wiring layer. Thus, the degradation of the PZT capacity polarization characteristic after the formation of the wiring layer can be restrained.

The inventors prepared the PZT capacitance element to have the wiring layer structure of not TiN/Al/TiN/WSix in the present invention but TiN/Al/TiN/WSix/Ti. In this case, however, it was confirmed that the residual polarization value decreases remarkably to less than 1 $\mu C/cm^2$ through the annealing process, similar to the case shown in FIG. 16.

Figure 17:
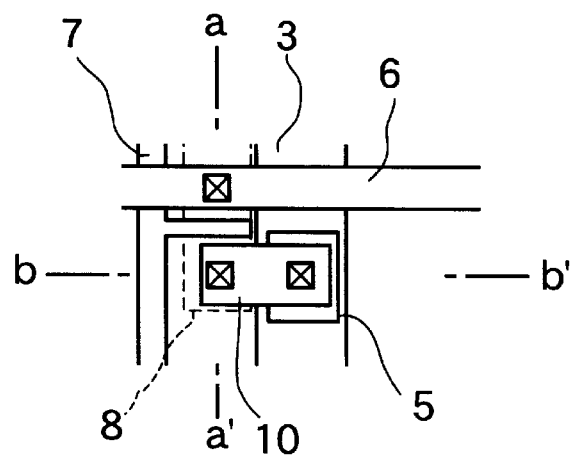
FIG. 17 is a plan view illustrating an example of the ferroelectric memory device to explain the effect of the ferroelectric memory device according to the embodiment of the present invention.
Figure 18:
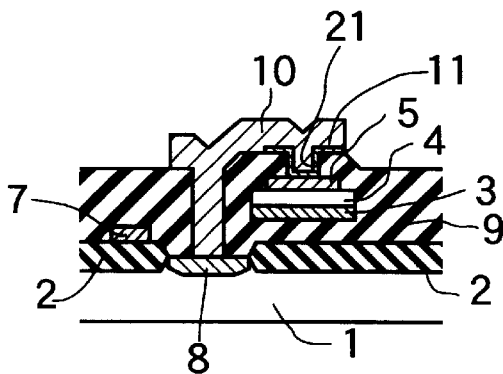
FIG. 18 is a cross sectional view of the ferroelectric memory device taken along the line b–b' of FIG. 16.

The inventors considered that the above effects of the WSix layer could be attained even in the ferroelectric capacitance element Cf in which only a region on the upper electrode was covered by the WSix layer. Thus, the inventors prepared the ferroelectric capacitance element having the structure shown in FIG. 17 and FIG. 18. FIG. 17 is a plan view of the ferroelectric capacitance element and FIG. 18 is a cross sectional view of the ferroelectric capacitance element taken along the line b–b'. In FIGS. 17 and 18, the WSi$_{2.4}$ layer exists in a region on the upper electrode 5 of the PZT capacitance element Cf through the capacity cover SiO$_2$ protecting film.

Figure 19A:
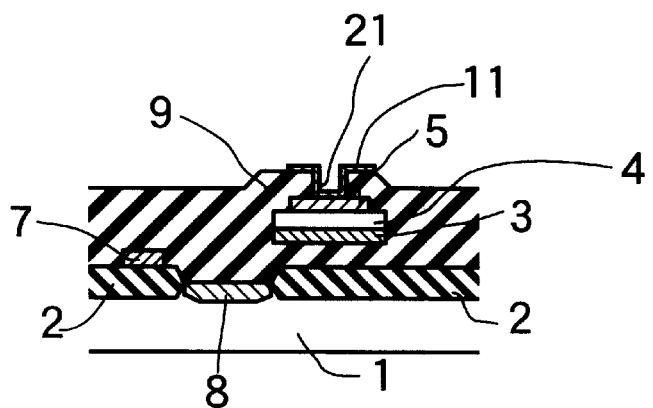
FIGS. 19A to 19C are cross sectional views illustrating of the ferroelectric memory device of FIG. 17 in a manufacturing process.
Figure 19B:
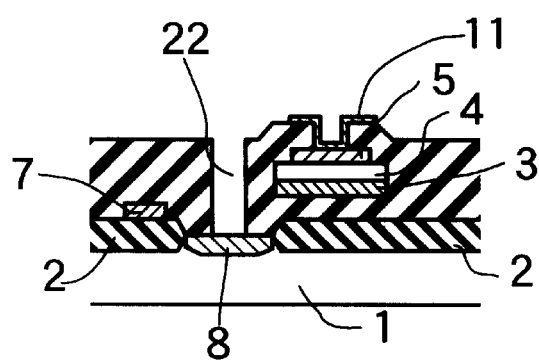
Figure 19C:
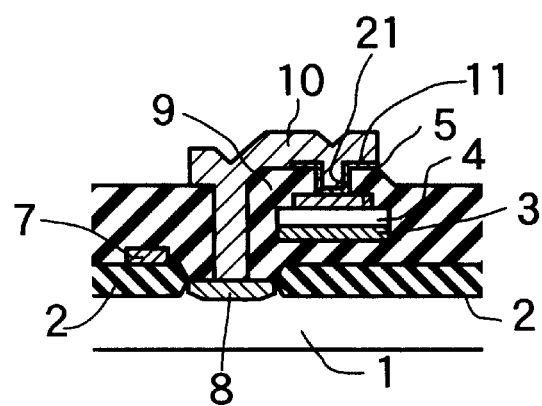

The wiring layer 10 is composed of the laminate layer of Ti, TiN, Al and TiN from the bottom. Such a structure is possible to be formed as follows. That is, the WSi$_{2.4}$ layer is formed by a sputtering method and then is patterned to have the same pattern as the upper electrode 5 of the PZT capacity by an RIE method. Subsequently, the Ti, TiN, Al and TiN layers are deposited in order from the bottom, as in the manufacturing process shown in FIGS. 19A to 19C.

Figure 20:
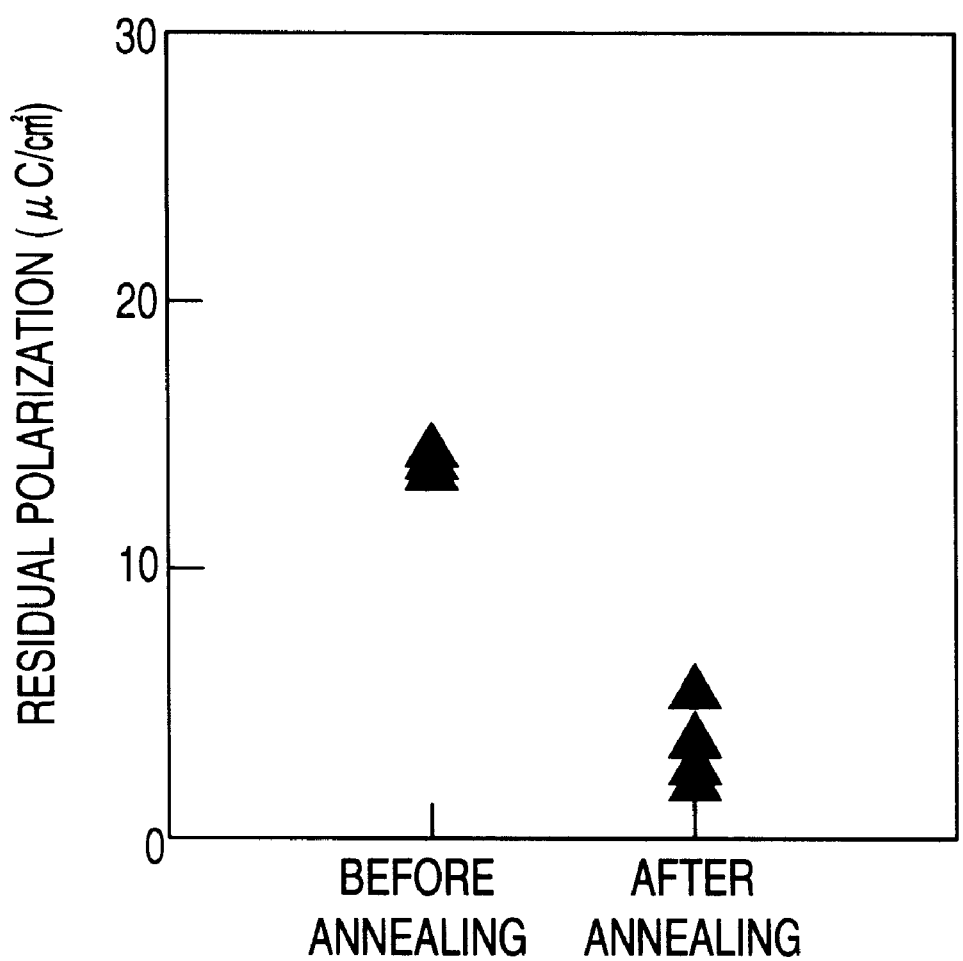
FIG. 20 is a diagram illustrating the change in residual polarization characteristic of the ferroelectric memory device of FIG. 17 before and after an annealing process.

However, when the wiring layer 10 was composed of TiN/AL/TiN/Ti like this case, the residual polarization value decreased to about 5 $\mu C/cm^2$ through the annealing process, as shown in FIG. 20. This result indicates that even if only the region above the capacitance element Cf is covered by the WSix layer, only an insufficient effect is obtained to restrain the degradation of the PZT capacity polarization characteristic through the annealing process. Therefore, it could be considered that the PZT capacitance element Cf is influenced by not only the wiring layer which exists directly above the capacitance element Cf but also the wiring layer which exists in another area.

Figure 21:
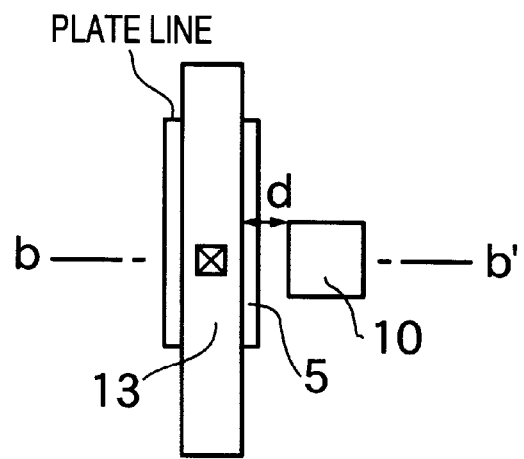
FIG. 21 is a cross sectional view illustrating the ferroelectric memory device according to another embodiment of the present invention.
Figure 22:
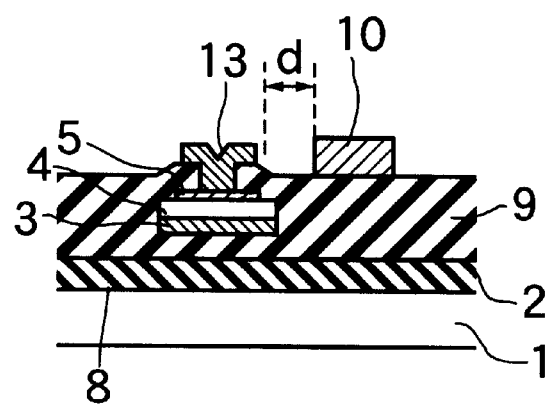
FIG. 22 is a cross sectional view of the ferroelectric memory device taken along the line b–b' of FIG. 21.

The inventors produced a capacitance element having the structure shown in FIG. 21 and FIG. 22 for the purpose to examine whether or not the bad influence to the PZT capacity polarization characteristic by the wiring layer through the annealing process is eliminated. Thus, the inventors inspected whether such bad influence can be prevented if the wiring layer is separated by a distance from the PZT capacity, when the conventional wiring layer which is composed of TiN/Al/TiN/Ti exists near the PZT capacitance element. FIG. 21 is a plan view of the PZT capacitance element and FIG. 22 is a cross sectional view of the PZT capacitance element taken along the line b–b' in FIG. 21.

A wiring layer 13 exists on the upper electrode 5 of the ferroelectric capacitance element Cf and has the structure of Ir (150 nm)/IrO$_2$ (50 nm) in the same manner as the upper electrode 5. Therefore, the wiring layer never has any bad influence to the PZT capacitance element through the annealing process.

The wiring layer 10 is composed of TiN/Al/TiN/Ti and separated from the upper electrode 5 of the PZT capacitance element Cf by a distance d.

Figure 23:
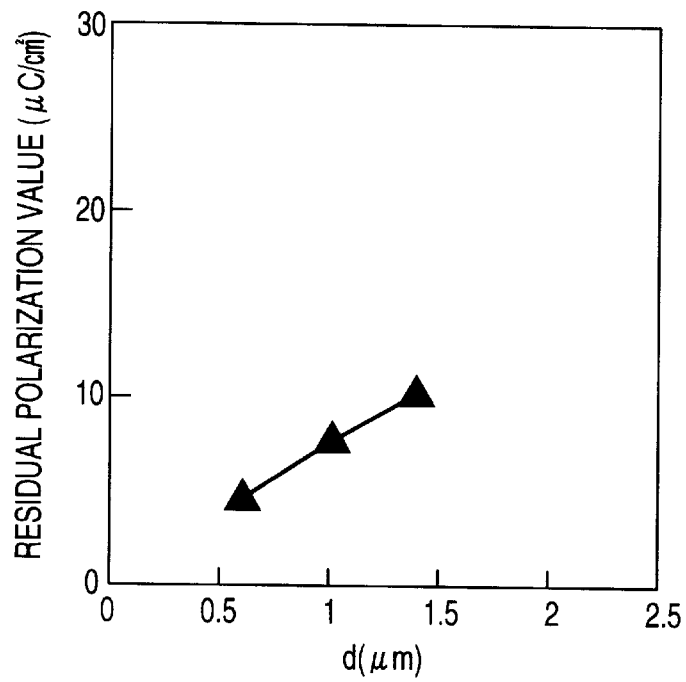
FIG. 23 is a graph illustrating measured data of the ferroelectric memory of FIG. 21.

FIG. 23 shows the residual polarization value of the PZT capacitance element Cf after the annealing process when the distance d is taken in the horizontal axis. As seen from FIG. 23, when the wiring layer 10 has the conventional wiring structure which is composed of TiN/Al/TiN/Ti, if the wiring layer 10 is present within about 2 $\mu$m from the PZT capacitance element Cf, conspicuous bad influence is given to the PZT capacitance polarization characteristic after the annealing process. Therefore, it is unsuitable that the wiring layer is present in the neighborhood (within about 2 $\mu$m) of the upper electrode 5 of the PZT capacitance element Cf and is formed of TiN/Al/TiN/Ti. Thus, it is desirable to form the bottom layer of WSix.

An example in which the upper electrode 5 of the ferroelectric capacitance element Cf is formed of metal silicide is described in Japanese Laid Open Patent Application (JP-A-Heisei 2-232973), Japanese Laid Open Patent Application (JP-A-Heisei 8-17822). However, it could be considered that the diffusion of the wiring layer material into the ferroelectric film through the annealing process is not restrained, or the temperature stress in the wiring layer 10 is not released, even if the upper electrode 3 is formed of metal silicide. This is because it could be considered that the metal silicide layer must exist between the wiring layer 10 and the PZT capacitance element Cf for the restraint of diffusion and the relaxation of the temperature stress. Also, it could be considered that it is difficult to fully restrain the degradation of the PZT capacity polarization characteristic which would be caused by the diffusion of the wiring layer material or the temperature stress through the annealing process, even if the upper electrode 5 of the ferroelectric capacitance element Cf is formed of metal silicide. This is because the degradation of the PZT capacity polarization characteristic through the annealing process is influenced by the wiring layer which exists within about 2 $\mu$m from the capacitance element Cf, in addition to the wiring layer directly above the capacitance element Cf, as mentioned above.

Also, when the lower electrode 3 is formed of metal silicide, the lower electrode material at the interface between the PZT film and the lower electrode is oxidized through the annealing process in the oxygen ambience when the PZT film is formed on the lower electrode 3 so that an insulating layer of the low dielectric constant is formed between the PZT and the lower electrode. As a result, the good polarization characteristic as the ferroelectric capacitance element cannot be obtained.

Also, when the upper electrode 5 is formed of metal silicide, an oxygen annealing process cannot be performed to make the interface between the upper electrode and the PZT film stable, after the upper electrode 5 is formed. Moreover, when the contact hole is formed to pass through to the upper electrode, the oxygen annealing process cannot be performed to remove the damage which is applied to the PZT film. This is because the metal silicide is oxidized so that it becomes difficult to establish the conductive state with the wiring layer, when the oxygen annealing process is performed. Or, the insulating layer of the low dielectric constant is formed at the interface between of the upper electrode and the PZT film, so that the good polarization characteristic as the ferroelectric capacity cannot be obtained. From these reasons, it is unsuitable to form the lower electrode 3 and the upper electrode 5 in the ferroelectric capacitance element Cf with the metal silicide. As described already, it is desirable that the lower electrode 3 and the upper electrode 5 are composed of noble metal having oxidization resistance or conductive oxide.

Figure 24:
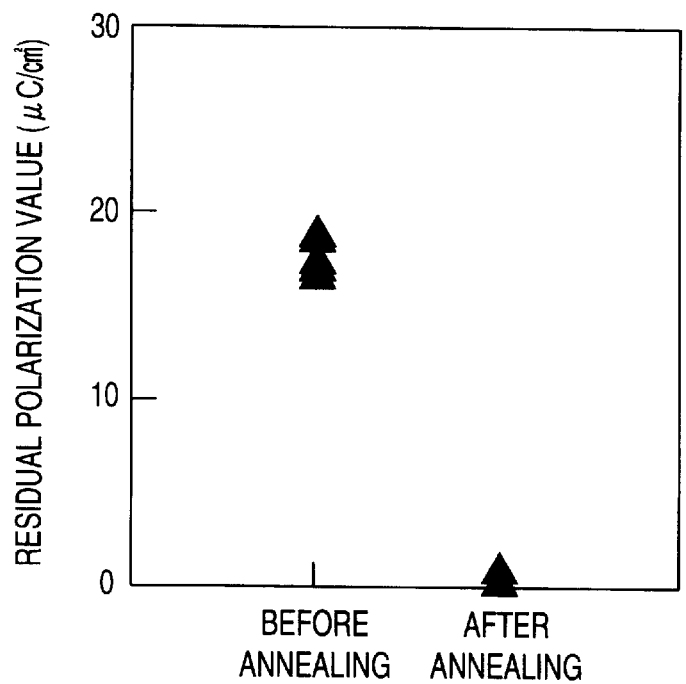
FIG. 24 is a diagram illustrating the change in residual polarization characteristic of the ferroelectric memory device of FIG. 17 before and after an annealing process.

On the other hand, when the PZT capacitance element Cf is manufactured to have the upper electrode 5 of not Ir/IrO$_2$ as in the present invention but Pt as in the conventional example, even if the wiring layer 10 is composed of TiN/Al/TiN/WSix as in the present invention, the degradation of the PZT capacity characteristic after the annealing process is remarkable as shown in FIG. 24. That is, the residual polarization value decreases to less than 1 $\mu$C/cm$^2$. In this case, there is no problem in that the Pt layer is laminated together with an IrO$_2$ layer and an Ir layer so as to form the upper electrode 5.

Therefore, the diffusion of the wiring layer material or the temperature stress can be considered as the causes of the degradation through the annealing process. Thus, it is possible to effectively restrain the degradation by forming the upper electrode of the material containing Ir or IrO$_2$ as a main component, and by forming the bottom layer of the wiring layer 10 connected with the ferroelectric capacitance element Cf and a portion of the wiring layer 10 near the ferroelectric capacitance element Cf using WSix, as in the present invention.

The ferroelectric memory device according to the second embodiment of the present invention will be described with reference to FIG. 27. In this embodiment, the wiring layer 10 shown in FIG. 9 is composed of TiN (30 nm)/Al (50 nm)/TiN (100 nm)/W (50 nm). The switching charge of the ferroelectric capacitance element Cf manufactured in the same manner as in the first embodiment is measured after the wiring layer formation and the annealing process.

Figure 25:
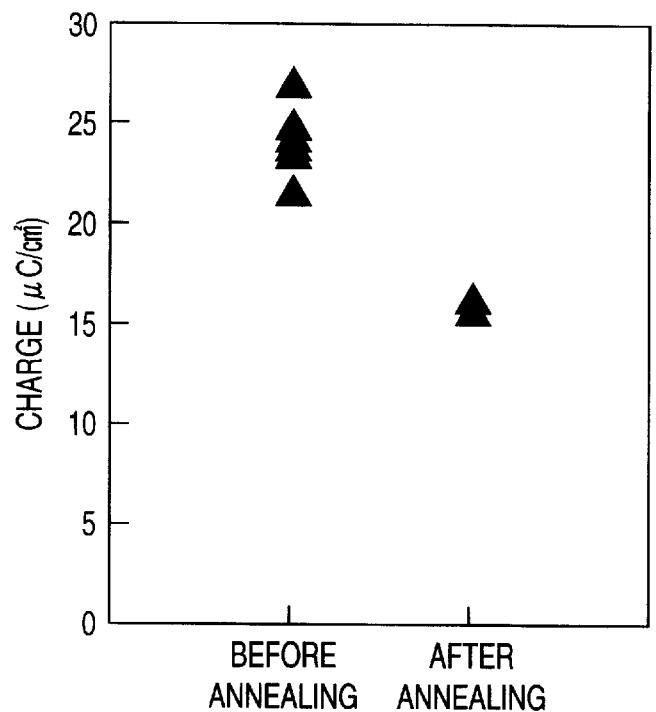
FIG. 25 is a graph illustrating measured data of the ferroelectric memory of the present invention.

FIG. 25 shows the measuring result of capacity at five points on the wafer surface. As shown in FIG. 25, even if the bottom layer of the wiring layer 10 is formed of W, the residual polarization value after the annealing process maintains about 17 $\mu$C/cm$^2$. Thus, the degradation of the PZT capacitance polarization characteristic is small.

Next, he ferroelectric memory device according to the third embodiment of the present invention will be described with reference to the drawings. In this embodiment, a WSi$_{2.5}$ layer with the film thickness of 200 nm is used for the wiring layer 10 shown in FIG. 9. After the ferroelectric capacitance element Cf is manufactured as in the first embodiment, the contact hole 21 is formed. After that, the WSi$_{2.5}$ layer is deposited by a DC sputtering method and patterned by an RIE method. The SiON film as the protecting layer is formed on the WSi$_{2.5}$ layer by a plasma CVD method to have the film thickness of 1 $\mu$m. Subsequently, the annealing process is performed for 30 minutes at the temperature of 400° C. in a nitrogen ambience. The switching charge of the ferroelectric capacitance element Cf formed in this way, after the WSi depositing process and the annealing process is measured.

Figure 26:
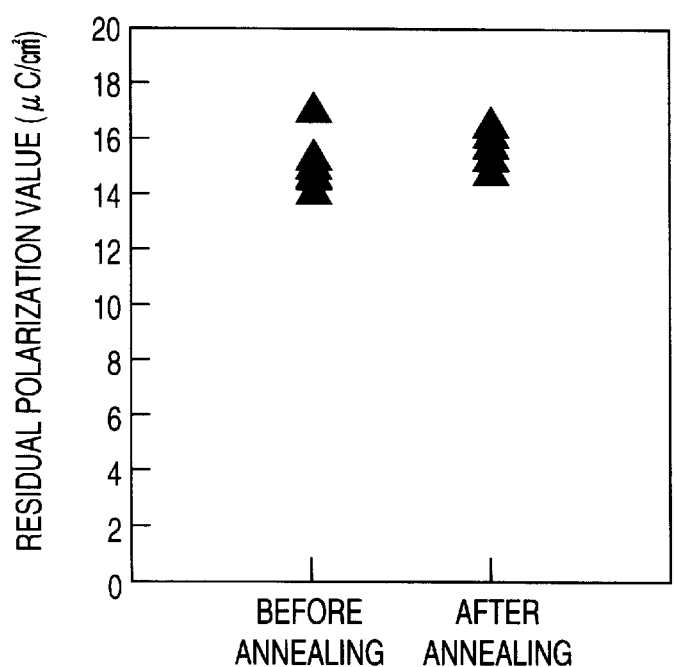
FIG. 26 is a graph illustrating another measured data of the ferroelectric memory of the present invention.

FIG. 26 shows the measuring result of capacitance element at five points on the wafer surface. Even if the protecting layer is formed and the annealing process is performed, the degradation of the residual polarization is not seen at all and the deviation decreases.

The first effect of the present invention is the improvement of reliability of the ferroelectric memory device. The heat treatment is performed to reduce the deviation of threshold voltages of the field effect transistors Tr and the heating process is performed to form the protecting film formed on the wiring layer, after the wiring layer is formed. However, there can be restrained the diffusion of the wiring layer material into the upper electrode and the decrease of the residual polarization value of the ferroelectric capacitance element due to the temperature stress of the wiring layer which are caused through the heat treatment and the annealing process. Therefore, the data rewriting lifetime and the storage data holding characteristic can be improved.

The second effect of the present invention is in that the production yield can be improved in the manufacturing of the ferroelectric memory device. Because the residual polarization value of the ferroelectric capacitance element Cf becomes high, the margin at the time of a data reading operation becomes large.

What is claimed is:

1. A ferroelectric memory device, comprising:
   a ferroelectric capacitance element formed through an insulating film on a semiconductor substrate,
   wherein said ferroelectric capacitance element comprises:
   a lower electrode;
   a ferroelectric film formed on said lower electrode; and
   an upper electrode formed on said ferroelectric film, and
   wherein said upper electrode has a laminate structure which contains a conductive oxide layer of first metal which is connected with said ferroelectric film;
   said ferroelectric memory device further comprising a wiring layer formed on said ferroelectric capacitance element through an insulating film, and connected with said upper electrode, and
   wherein a bottom layer of said wiring layer is formed of a tungsten layer or a metal silicide layer, and
   wherein said metal silicide layer is a tungsten silicide (WSix) layer.

2. A ferroelectric memory device according to claim 1, wherein said first metal is iridium (Ir), and said conductive oxide layer is an iridium oxide (IrO$_2$) layer.

3. A ferroelectric memory device according to claim 2, wherein said laminate structure of said upper electrode is formed of said conductive oxide layer and a layer of iridium or platinum.

4. A ferroelectric memory device according to claim 2, wherein a top layer of the laminate structure of said upper electrode connected to a wiring layer is a layer of iridium or platinum.

5. A ferroelectric memory device according to claim 1, wherein said bottom layer of a portion of said wiring layer within 2 $\mu$m from said upper electrode is formed of a tungsten layer or a metal silicide layer.

6. A ferroelectric memory device according to claim 5, wherein said wiring layer is formed of a titanium nitride layer and an alloy layer containing aluminum and laminated on said tungsten layer or said metal silicide layer.

7. A ferroelectric memory device, comprising:

a ferroelectric capacitance element formed through a first insulating film on a semiconductor substrate; and a wiring layer formed on said ferroelectric capacitance element through a second insulating film, wherein said ferroelectric capacitance element comprises:

a lower electrode;

a ferroelectric film formed on said lower electrode; and an upper electrode formed on said ferroelectric film and connected to said wiring layer, and wherein said wiring layer has a laminate structure having one of a tungsten layer or a metal silicide layer as a bottom layer.

8. A ferroelectric memory device according to claim 7, wherein said upper electrode has a laminate structure containing a conductive oxide layer of first metal as a bottom layer.

9. A ferroelectric memory device according to claim 7, wherein said first metal is iridium (Ir), and said conductive oxide layer is an iridium oxide ($IrO_2$) layer.

10. A ferroelectric memory device according to claim 9, wherein said laminate structure of said upper electrode is formed of said conductive oxide layer and a layer of iridium or platinum.

11. A ferroelectric memory device according to claim 9, wherein a top layer of the laminate structure of said upper electrode connected to a wiring layer is a layer of iridium or platinum.

12. A ferroelectric memory device according to claim 7, wherein said bottom layer of a portion of said wiring layer within 2 $\mu$m from said upper electrode is formed of a tungsten layer or a metal silicide layer.

13. A ferroelectric memory device according to claim 12, wherein said wiring layer is formed of a titanium nitride layer and an alloy layer containing aluminum and laminated on said tungsten layer or said metal silicide layer.

14. A ferroelectric memory device according to claim 7, wherein said metal silicide layer is a tungsten silicide (WSix) layer.

15. A ferroelectric memory device according to claim 7, wherein said ferroelectric film of said ferroelectric capacitance element is $PtZr_xTi_{1-x}O_3$ or $SrBi_2(Ta_xNb_{2-x})_2O_9$.

16. A method of manufacturing a ferroelectric memory device, comprising:

forming through an insulating film on a semiconductor substrate, a ferroelectric capacitance element which is composed of a lower electrode, a upper electrode, and a ferroelectric film which is sandwiched between the upper electrode and the lower electrode;

forming a protecting film on the ferroelectric capacitance element;

providing a contact hole in the protecting film to pass through to the upper electrode; and forming a metal silicide layer or a tungsten layer in the contact hole and on the protecting film.

17. A method according to claim 16, further comprising:

etching a surface layer of the upper electrode or lower electrode, before the step of forming the metal silicide layer or the tungsten (W) layer.

18. A method according to claim 16, further comprising:

forming a wiring layer which contains aluminum, titanium or titanium nitride as a main component, after the step of forming the metal silicide layer or the tungsten layer.

* * * * *